United States Patent [19]

Ohtani et al.

[11] Patent Number: 4,779,339
[45] Date of Patent: Oct. 25, 1988

[54] METHOD OF PRODUCING PRINTED CIRCUIT BOARDS

[75] Inventors: Yasuaki Ohtani; Fusao Birukawa, both of Saitama, Japan

[73] Assignee: Nippon CMK Corporation, Saitama, Japan

[21] Appl. No.: 47,151

[22] Filed: May 6, 1987

[51] Int. Cl.$^4$ ............................................. H05K 3/10
[52] U.S. Cl. ................................. 29/846; 179/68.5; 427/96
[58] Field of Search ............ 174/68.5; 427/96; 29/832, 834, 836, 846

[56] References Cited

U.S. PATENT DOCUMENTS

| 3,250,848 | 5/1966 | Beelitz et al. | 174/68.5 |
| 3,567,844 | 3/1971 | Kremar | 174/68.5 |
| 3,610,811 | 10/1971 | O'Keefe | 174/68.5 |
| 3,619,899 | 11/1977 | Takeda et al. | 174/68.5 X |
| 4,301,189 | 11/1981 | Arai et al. | 427/96 |
| 4,413,309 | 11/1983 | Takahashi et al. | 174/68.5 X |
| 4,638,116 | 1/1987 | Gumb | 174/68.5 |

Primary Examiner—Timothy V. Eley
Assistant Examiner—Carl J. Arbes
Attorney, Agent, or Firm—Emmanuel J. Lobato; Robert E. Burns

[57] ABSTRACT

A method of producing printed circuit boards comprises the steps of applying a first solder resist on the conductor circuit pattern so as to surround lands to be soldered in the pattern and then applying a second solder resist to the whole surface of the pattern so as to leave portions having a size larger than the size of the land and smaller than the outer diameter of the first solder resist.

3 Claims, 1 Drawing Sheet

METHOD OF PRODUCING PRINTED CIRCUIT BOARDS

BACKGROUND OF THE INVENTION

1. Field of the Invention

This invention relates to a method of producing printed circuit boards.

2. Related Art Statement

In general, the printed circuit board is constructed by forming a given circuit pattern on an insulation substrate through an electric conductor and assembling a given electronic part on the circuit pattern.

The assembling of the electronic part on the printed circuit board is carried out by immersing the circuit pattern surface of the printed circuit board in a fused solder bath or a jet type solder bath at a state of mounting the electronic part on the printed circuit board to attach solder to the circuit pattern surface to thereby electrically and mechanically connect leads of the electronic part to the circuit pattern.

In the soldering between the circuit pattern and the lead of the electronic part, a solder resist is previously applied to the whole surface of the circuit pattern other than land portions to be soldered in order to attach the solder to only the connecting portions therebetween. However, the distance between the adjoining circuits becomes narrower with the miniaturization of the circuit pattern and hence the distance between the lead of the electronic part and the connecting land becomes also narrower, whereby the function inherent to the solder resist is damaged to caused bridging phenomenon between mutual lands due to the soldering. Therefore, it is frequently required to conduct the correction operation and the like.

In order to prevent such a bridging of solder, particularly the bridging of solder at a position of narrow land distance, there is adopted a method, wherein a conductor pattern is printed on an insulation substrate, and a first soldered resistor layer is formed over the whole surface of the conductor pattern so as to leave lands to be soldered, and a second soldered resistor layer for preventing the bridging of solder on at least positions of narrow land distance is formed on the first soldered resistor layer in the production of the printed circuit board. This method has been disclosed in Japanese Patent Application Publication No. 54-41162.

However, when the second soldered resistor layer for the prevention of the bridging is formed on the first soldered resistor layer, since the first soldered resistor layer is previously formed over the whole surface of the conductor pattern so as to leave lands to be soldered, it is required to have a high aligning accuracy for leaving the lands to be soldered. Further, since the second soldered resistor layer for the prevention of the bridging is formed on the first soldered resistor layer after the formation of the first soldered resistor layer on the conductor pattern, the solder resist ink through screen printing for the formation of the second soldered resistor layer is undesirably oozed out on the land portions to be soldered in addition to the above aligning accuracy.

SUMMARY OF THE INVENTION

It is an object of the invention to overcome the aforementioned problems of the conventional technique and to provide a method of producing printed circuit boards, which can perform the application of the solder resist with a rough aligning accuracy as compared with the conventional high aligning accuracy without oozing onto the land portion and can improve the quality of solder fillet in the soldering between land and lead of electronic part.

According to the invention, there is the provision of a method of producing a printed circuit board comprising the steps of forming a conductor circuit pattern on an insulating substrate;

applying a solder resist so as to surround lands to be soldered in the circuit pattern; and applying a second solder resist to the front face of the circuit pattern so as to leave portions having a size larger than the size of the land to be soldered and smaller than the outer diameter of the first solder resist portion surrounding the lands.

DESCRIPTION OF THE PREFERRED EMBODIMENTS

According to the invention, after a first solder resist is applied to a circuit pattern face so as to surround lands to be soldered, a second solder resist is applied to the whole face of the circuit pattern, whereby the difficulty of the aligning accuracy is mitigated to improve the workability and prevent the oozing of the solder resist on the land portion. Further, the soldering fillet can be enhanced by applying the second solder resisit so as to surround the lands to be soldered, whereby the scattering in the soldered portion can be solved to improve the stability of quality.

The invention will be described with reference to the accompanying drawings below.

Figure 1:
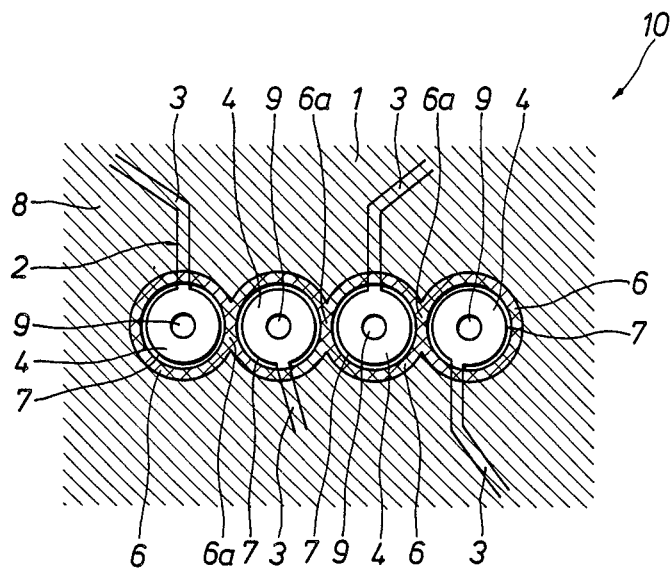
FIG. 1 is a partial plan view of a first embodiment of the printed circuit board produced according to the invention.

In FIG. 1 is partly shown a first embodiment of the printed circuit board produced by the method of the invention, wherein numeral 1 is an insulating substrate, and numeral 2 is a circuit pattern of conductors formed on one surface of the substrate.

The circuit pattern 2 is formed by a method of etching a copper foil of a copper laminate plate or by the other conventional known method.

Thereafter, a first solder resist 6 is applied so as to surround each of the lands 4 formed at each end of circuits 3 in the circuit pattern 2 for connecting to a lead of an electronic part.

The application of the solder resist 6 is carried out by screen printing with the ordinary solder resist ink, whereby annular solder resists 6 each having an inner diameter equal to or somewhat larger than the outer diameter of the land 4 and a width of about 0.5 mm are formed.

Thus, a space 7 is formed between the outer diameter of the land and the inner diameter of the annual solder resist 6.

Moreover, an overlap portion 6a of the annular solder resist 6 between the adjoining lands 4 is formed by the lapped portion between the mutual annular solder resist portions.

After the formation of the first solder resist surrounding the each land 4, a second solder resist 8 is applied to the whole surface of the circuit pattern 2 except the lands 4 to produce a printed circuit board 10.

In this case, the second solder resist 8 is applied to the whole surface of the circuit pattern 2 so as to leave a portion having a diameter larger than the outer diameter of the land 4 and smaller than the outer diameter of the annular solder resist 6.

In the first embodiment, therefore, the annular solder resist 6 is applied prior to the application of the second solder resist 8 to the whole surface of the circuit pattern 2, so that it is enough to align only the annular solder resist 6 with the respective portion of the circuit pattern 2, whereby the aligning operation can be simplified in the application of the solder resist 6 and the formation of the annular solder resist 6 on the land portion 4 can be performed without scattering.

As shown in FIG. 1 the above operations can be improved by arranging the space 7 between the outer diameter of the land 4 and the inner diameter of the annular solder resist 6.

In addition, when the soldering is carried out after a lead of an electronic part (not shown) is inserted into a hole for the insertion of the lead in the land 4, the solder fillet becomes high by upheaving of the annular solder resist 6 surrounding the land 4, whereby the formation of short circuit between the lands 4 can be prevented.

After the formation of the annular solder resist 6 at the land 4, the second solder resist 8 is applied over the whole surface of the circuit pattern so as to leave a portion having a size larger than the outer diameter of the land 4 but smaller than the outer diameter of the annular solder resist 6, so that the aligning operation to the land 4 is further simplified in the application of the solder resist 8 through screen printing, whereby the application of the solder resist itself can be performed simply and accurately and the oozing of the solder resist ink on the land 4 can be prevented.

Figure 2:
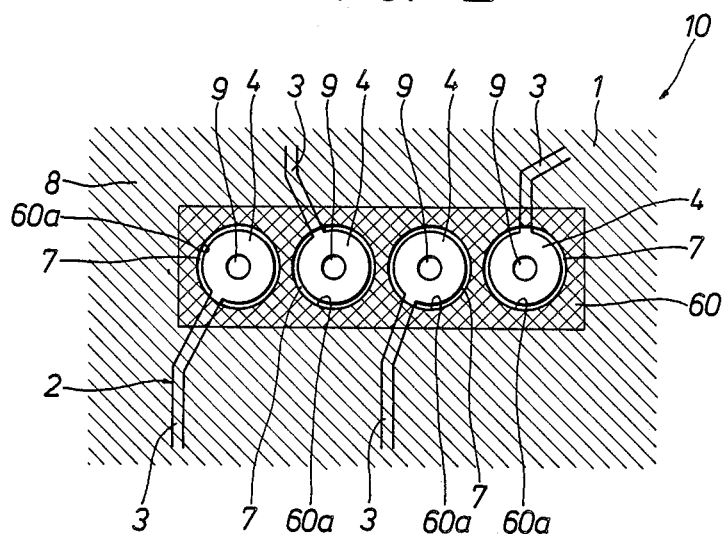
FIG. 2 is a partial plan view of a second embodiment of the printed circuit board according to the invention.

In FIG. 2 is shown a second embodiment of the printed circuit board produced by the method of the invention.

The second embodiment is different from the first embodiment in only the formation of the solder resist 6 on the land 4.

That is, the annular solder resist 6 is formed so as to surround the land 4 in the first embodiment, while in the second embodiment a rectangular solder resist 60 surrounding the lands 4 is formed so as to leave portions 60a each having a size somewhat larger than the outer diameter of the land 4.

In the second embodiment, the same part is represented by the same numeral as in the first embodiment except the first solder resist, and explanation thereof is omitted.

Moreover, the outer profile of the solder resist 60 is not limited to the rectangular profile, and various profiles may be taken in accordance with the design condition.

The same function and effect as in the first embodiment are obtained in the second embodiment.

Although the first and second embodiments have been described with respect to the lands in a part of the circuit pattern, it is a matter of course that the solder resist 6 or 60 is applied to all lands 4 to be soldered in the circuit pattern 2.

According to the invention, the first solder resist can simply and accurately be applied to the lands to be soldered in the circuit pattern and also the aligning operation in the application of the secound solder resist can be simplified so as to leave lands to be soldered and the oozing of the solder resist ink on the land can be prevented.

What is claimed is:

1. A method of producing a printed circuit board free of solder bridging comprising the steps of:

forming on an insulating substrate a selected conductor circuit patterns, applying a first solder resist in individual annular configurations about corresponding individual lands to be soldered and each portion of the resist having an inner diameter somewhat larger than an outer diameter of a corresponding land to be soldered and having a uniform distance between said inner and said outer diameter not less than 0.5 mm, and applying a second solder resist to a front face of the circuit pattern so as to leave uncovered an individual area about each land having an inner diameter larger than the size of the corresponding land and at least as large as the inner diameter of the first solder resist and having an area outer diameter less than an outer diameter of the corresponding first solder resist annular configuration in order to provide said printed circuit board free from solder bridging.

2. A method of producing a printed circuit board free of solder bridging comprising the steps of:

forming on an insulating substrate a selected conductor circuit pattern, applying a first solder resist in a rectangular area configuration about several circularly shaped lands to be soldered so as to leave uncovered circular spaces free of the first resist about individual corresponding lands, each circular space having an inner diameter somewhat larger than an outer diameter of a corresponding land to be soldered, and applying a second solder resist to a front face of the conductor circuit pattern so as to leave uncovered individual areas each about a respective land, each uncovered area having an inner diameter larger than the size of the corresponding land and having an outer diameter less than an outer diameter of the corresponding uncovered circular spaces of the first solder resist in order to provide said printed circuit board free of solder bridging.

3. A method of producing a printed circuit board free of solder bridging comprising the steps of:

forming on an insulating substrate a selected conductor circuit pattern, applying a first solder resist on an area having a given configuration about a plurality of circularly shaped lands to be soldered, said given area having first resist-free spaces each having an inner diameter somewhat larger than an outer diameter of a corresponding land within a corresponding resist-free space, and applying a second solder resist on a front face of the circuit pattern so as to leave uncovered individual areas about each land, each area left uncovered being larger than the size of a corresponding land therein and having an outer diameter less than an outer diameter of a corresponding first resist-free space about the corresponding land in order to provide said printed circuit board free of solder bridging.

* * * * *